US007157740B2

(12) United States Patent
Fujita

(10) Patent No.: US 7,157,740 B2
(45) Date of Patent: Jan. 2, 2007

(54) ELECTRO-OPTICAL DEVICE AND ELECTRONIC APPARATUS

(75) Inventor: Shin Fujita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 131 days.

(21) Appl. No.: 11/036,370

(22) Filed: Jan. 18, 2005

(65) Prior Publication Data

US 2005/0179037 A1 Aug. 18, 2005

(30) Foreign Application Priority Data

Feb. 16, 2004 (JP) ............................ 2004-038153

(51) Int. Cl.
*H01L 29/15* (2006.01)

(52) U.S. Cl. .......................... 257/72; 257/59; 257/691; 257/E27.133

(58) Field of Classification Search .................. 257/72
See application file for complete search history.

(56) References Cited

U.S. PATENT DOCUMENTS

2002/0159016 A1* 10/2002 Nishida et al. ............. 349/141

FOREIGN PATENT DOCUMENTS

JP A-2002-49330 2/2002
JP B2-3297985 4/2002

* cited by examiner

*Primary Examiner*—Tu-Tu Ho
(74) *Attorney, Agent, or Firm*—Oliff & Berridge PLC

(57) ABSTRACT

To provide an electro-optical device and an electronic apparatus that have less parasitic capacitance between wiring lines resulted from the crossing wiring lines and operates at a high speed. The electro-optical device includes a first main signal wiring line which is arranged to correspond to a unit circuit and which transmits a predetermined signal; a first sub signal wiring line whose width is narrower than that of the first main signal wiring line; a second main signal wiring line arranged between the first main signal wiring line and the first sub signal wiring line; a first connection wiring line which is connected to the first main signal wiring line and the first sub signal wiring line and which is bridged over the second main signal wiring line; and an internal circuit having a plurality of elements connected to the first sub signal wiring line. The predetermined signal is branched from the first main signal wiring line and is supplied to the internal circuit through the first sub signal wiring line.

9 Claims, 7 Drawing Sheets

PRIOR ART

ELECTRO-OPTICAL DEVICE AND ELECTRONIC APPARATUS

BACKGROUND

The present invention relates to an electro-optical device such as a liquid crystal display device, an organic electro-luminescent (EL) display device or the like, and an electronic apparatus including the same.

An liquid crystal display device which uses a liquid crystal as an electro-optical material is a display device which takes the place of a cathode ray tube (CRT), and is widely used in a display unit of various information processing apparatuses or a liquid crystal TV or the like.

Such a electro-optical device has, for example, an internal driving circuit including a scanning line driving circuit and a data line driving circuit provided on a substrate, an internal driving circuit such as a scanning line test circuit and a data line test circuit or the like, and a plurality of terminals electrically connected to the internal driving circuit. In addition, components are mounted on the plurality of terminals, and predetermined type signals are supplied from an external driving circuit connected to the components. In addition, the internal driving circuit drives and scans a plurality of pixels to have images displayed or to have pixel defects or the like tested, based on the predetermined type signals supplied through the plurality of terminals.

Since the electro-optical panel of the electro-optical device is fabricated in a large-sized manner and its built-in circuits have various functions, it has a tendency that wiring lines for signals supplied from an input terminal of the electro-optical panel become thicker and the number of the wiring lines also increase.

FIG. 1 is a plan view showing a layout of wiring lines in accordance with a conventional electro-optical panel. In the conventional electro-optical panel, a plurality of main signal wiring lines 32, 34, and 36 having large wiring line widths, respectively is arranged parallel to each other per unit circuit. In addition, signals which have been transmitted through the main signal wiring lines 32, 34, and 36 are supplied from the plurality of main signal wiring lines 32, 34, and 36 to thin film transistors (TFTs) 52 constituting the internal circuit through sub signal wiring lines 62, 64, and 66, respectively.

As such, with the structure that the plurality of main signal wiring lines 32, 34, and 36 is arranged parallel to each other and signals are supplied from the main signal wiring lines 32, 34, and 36 to the internal circuit per unit circuit, the sub signal wiring line 62 supplies to the internal circuit the signals which have been transmitted through the main signal wiring line 32 and which is bridged over the main signal wiring lines 34 and 36. For this reason, the number of crossing areas between the sub signal wiring line 62 and the main signal wiring lines 34 and 36 increases, which leads to an increase in the crossing capacitance between the wiring lines. As a result, when the wiring parasitic capacitance increases, a signal transmission is delayed, which results in causing a problem that the signal may not be raised or fallen within an expected time. To cope with the problem, there exists a liquid crystal display device which decreases the time constant by increasing the wiring line width to decrease the wiring resistance or decreases the parasitic capacitance by means of research on the circuit (for example, see Patent Document 1).

[Patent Document 1] Japanese Unexamined Patent Application Publication No. 10-199284.

However, when the wiring line width increases to reduce a resistance in order to reduce the signal delay accompanying the increase of the crossing capacitance between the wiring lines in the conventional liquid crystal display device, the crossing areas accompanying the increase of the wiring line width increases, so that the crossing capacitance between the wiring lines also increases. As a result, since the parasitic capacitance increases, the effect of decreasing the time constant accompanying the increase of the wiring line width is insignificant. On the other hand, when the parasitic capacitance decreases by means of the research on the circuit, the circuit structure becomes complicated.

Accordingly, the present invention is designed to solve the above-mentioned problems, and it is an object of the present invention to provide an electro-optical device and an electronic apparatus which is capable of overcoming the above-mentioned problems. This object is composed of a combination of features described in independent claims in the claims. In addition, dependent claims define specific examples which are advantageous for the present invention.

SUMMARY

In order to achieve the above-mentioned object, according to a first aspect of the present invention, there is provided an electro-optical device comprising: a first main signal wiring line which is arranged to correspond to a unit circuit and which transmits a predetermined signal; a first sub signal wiring line whose width is narrower than that of the first main signal wiring line; a second main signal wiring line arranged between the first main signal wiring line and the first sub signal wiring line; a first connection wiring line which is connected to the first main signal wiring line and the first sub signal wiring line and which is bridged over the second main signal wiring line; and an internal circuit having a plurality of elements connected to the first sub signal wiring line, wherein the predetermined signal is branched from the first main signal wiring line and is supplied to the internal circuit through the first sub signal wiring line.

According to the above-mentioned structure, when the plurality of elements is connected to the first main signal wiring line, the corresponding elements are electrically connected to the first main signal wiring line through the first sub signal wiring line. In this case, the second main signal wiring line is arranged between the first main signal wiring line and the first sub signal wiring line. As a result, the wiring line which connects the corresponding elements to the first sub signal wiring line is not bridged over the first and second main signal wiring lines, so that the areas where the wiring lines cross may decrease. Furthermore, when the width of the first sub signal wiring line is made narrower than that of the first main signal wiring line, the parasitic capacitance due to the crossing wiring lines may decrease, so that the time constant of the signal transmitting characteristic may significantly decrease, which may provide the electro-optical device operating at a high speed and having less operation errors.

In addition, according to the above-mentioned structure, even when the width of the first main signal wiring line increases for the sake of decreasing the wiring resistance, the areas where the wiring lines cross does not significantly increase. Accordingly, the parasitic capacitance due to the crossing wiring lines may be suppressed even when the width of the first main signal wiring line increases.

In addition, in the electro-optical device, the first and second main signal wiring lines are preferably arranged substantially parallel to each other. Furthermore, the first sub signal wiring line is preferably arranged substantially parallel to the first and second main signal wiring lines. In addition, the first connection wiring line is preferably arranged to be approximately vertical to the first and second main signal wiring lines and the first sub signal wiring line.

The electro-optical device further includes a second sub signal wiring line whose width is narrower than that of the second main signal wiring line; and a second connection wiring line which is connected to the second main signal wiring line and the second sub signal wiring line and which is bridged over the first sub signal wiring line, wherein the plurality of elements is preferably connected to the second sub signal wiring line, and the second main signal wiring line is preferably arranged between the first main signal wiring line and the second sub signal wiring line.

According to the above-mentioned structure, the wiring line which connects the plurality of elements to the second sub signal wiring line is not bridged over the first and second main signal wiring lines, so that the area where the wiring lines cross may decrease. Accordingly, the increase of the parasitic capacitance due to the crossing wiring lines may be suppressed.

For example, the first sub signal wiring line is arranged between the second main signal wiring line and the second sub signal wiring line. In addition, the second sub signal wiring line may also be arranged between the second main signal wiring line and the first sub signal wiring line. Alternatively, the first and second sub signal wiring lines may be arranged between the plurality of elements, and the first and second main signal wiring lines.

The electro-optical device further includes a third main signal wiring line arranged between the first main signal wiring line and the first and second sub signal wiring lines, wherein the first and second connection wiring lines are further bridged over the third main signal wiring line, and the plurality of elements is connected to the third main signal wiring line.

According to the above-mentioned structure, even when other wiring line is further arranged between the plurality of elements and the first and second main signal wiring lines, the wiring line which connects the first sub signal wiring line to the second sub signal wiring line is not bridged over the main signal wiring line, and each element is electrically connected to the first or second main signal wiring line. Accordingly, even when main signal wiring lines whose widths are large are plural, the areas where the wiring lines cross may decrease. Accordingly, the increase of the parasitic capacitance due to the crossing wiring lines may be suppressed.

The electro-optical device further includes a third sub signal wiring line whose width is narrower than that of the third main signal wiring line; and a third connection wiring line connected to the third main signal wiring line and the third sub signal wiring line, wherein the plurality of elements is preferably arranged between the third main signal wiring line and the third sub signal wiring line, and is preferably connected to the third main signal wiring line through the third sub signal wiring line. The third main signal wiring line is preferably arranged substantially parallel to the first and second main signal wiring lines. In addition, the third sub signal wiring line is preferably arranged substantially parallel to the first and second sub signal wiring lines.

According to the above-mentioned structure, the plurality of elements and the third sub signal wiring line may be connected to each other so as not to bridge the wiring line of connecting the plurality of elements to the third sub signal wiring line over the first and second sub signal wiring lines. Accordingly, the areas where the wiring lines cross may further decrease, so that the increase of the parasitic capacitance due to the crossing wiring lines may be suppressed.

In addition, even when the corresponding wiring line is bridged over the first and second sub signal wiring lines, the areas where the wiring lines cross may further decrease as compared to the case that each element is connected to the third main signal wiring line.

In the electro-optical device, the plurality of elements may have a first element group and a second element group, wherein the first element group may be connected to the first sub signal wiring line and the third main signal wiring line, and the second element group may be connected to the second sub signal wiring line and the third main signal wiring line.

According to a second aspect of the present invention, there is provided an electronic apparatus including the electro-optical device. In this case, the electronic apparatus means a general apparatus which has the electro-optical device with predetermined functions according to the present invention, and its structure is not specifically limited, however, devices such as a computer device, a display device, a cellular phone, a personal handyphone system (PHS), a personal digital assistant (PDA), an electronic note or the like, which include the electro-optical device, may be employed.

DETAILED DESCRIPTION OF EMBODIMENTS

Hereinafter, embodiments of the present invention will be described with reference to the accompanying drawings, however, these embodiments are not intended to limit the present invention according to the claims, and all combinations of features described in the embodiments are not essential for solutions of the present invention. In addition, the embodiments below correspond to the cases in which an electro-optical device of the present invention is applied to a liquid crystal display device.

Figure 2:
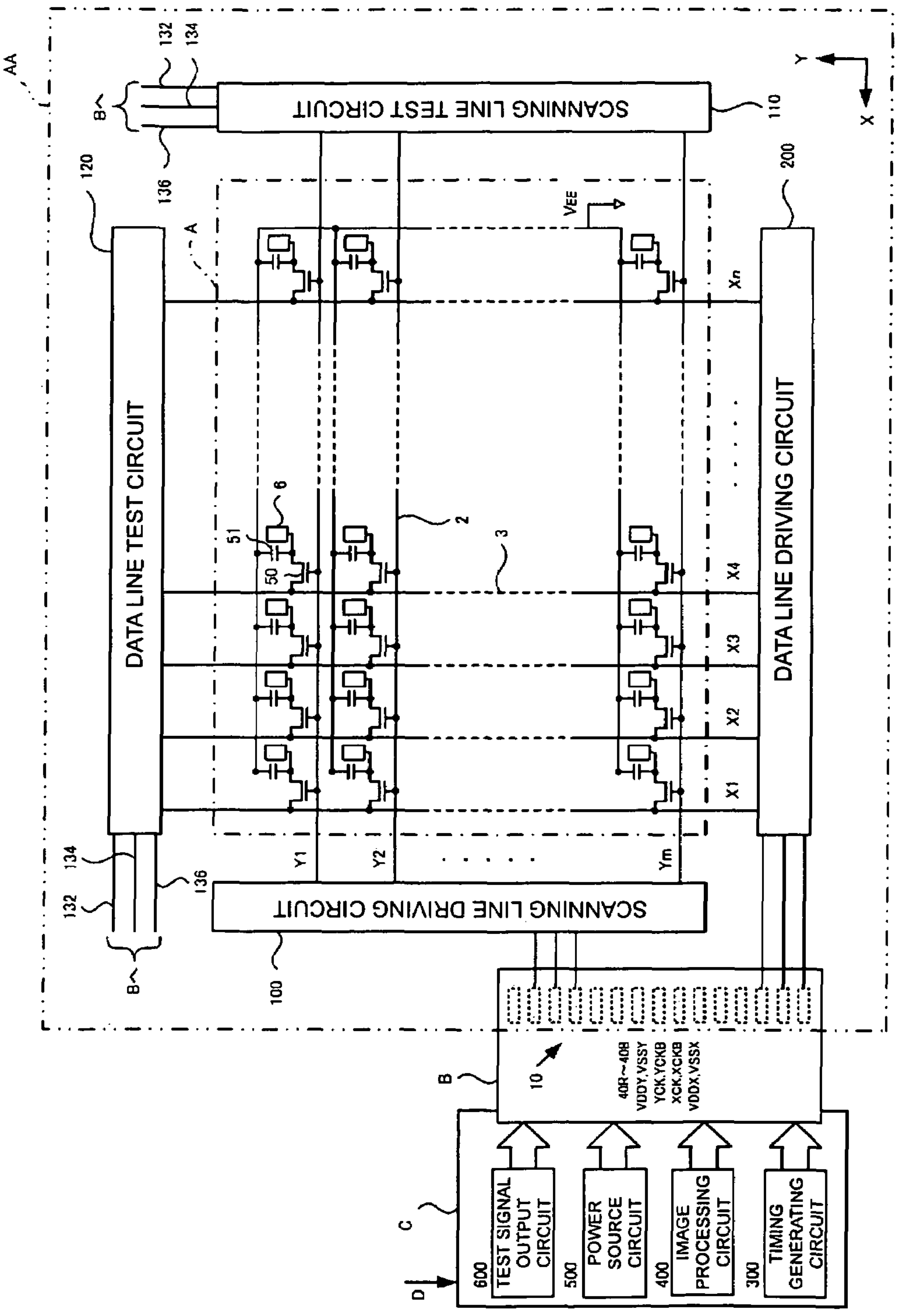
FIG. 2 is a diagram showing a structure of a liquid crystal display device as an example of an electro-optical device of the present invention.

FIG. 2 is a block diagram showing an electrical configuration according to a first embodiment of a liquid crystal display device as one example of an electro-optical device of the present invention. Referring to FIG. 2, an overall structure of the liquid crystal display device of the present embodiment is first described. As shown in FIG. 2, the liquid crystal display device includes a liquid crystal panel AA as an example of electro-optical panels, a flexible substrate B as an example of mounting members, and an external substrate C. The external substrate C includes a timing generating circuit 300, an image processing circuit 400, a power source circuit 500, and a test signal output circuit 600, as examples of external driving circuits. Input image data D supplied to the liquid crystal display device have, for example, three-bit parallel formats. The timing generating circuit 300 generates a Y clock signal YCK, an inverted Y clock signal YCKB, an X clock signal XCK, an inverted X clock signal XCKB, a Y transport start pulse DY, and an X transport start pulse DX in synchronization with the input image data D. In addition, the timing generating circuit 300 generates various timing signals for controlling the image processing circuit 400 and outputs them.

The Y clock signal YCK specifies a period for selecting a scanning line 2, and the inverted Y clock signal YCKB indicates a logical level which is inverted from the Y clock signal YCK. The X clock signal XCK specifies a period for selecting a data line 3, and the inverted X clock signal XCKB indicates a logical level which is inverted from the X clock signal XCK.

The image processing circuit 400 performs gamma correction or the like on the input image data D in consideration of the light transmission characteristics of the liquid crystal panel AA, and has image data of each color of Red, Green, and Blue colors subjected to Digital to Analog (D/A) conversion to generate image signals 40R, 40G, and 40B.

The power source circuit 500 generates the power necessary for operating the scanning line driving circuit 100 and the data line driving circuit 200 as well as supplying the power for the timing generating circuit 300, the image processing circuit 400, and the test signal output circuit 600.

Various control signals and the power which have been generated as described above, are supplied to the liquid crystal panel AA through the flexible substrate B.

The liquid crystal panel AA includes a terminal group 10, an image display region A, a scanning line driving circuit 100, a data line driving circuit 200, a scanning line test circuit 110, and a data line test circuit 120 provided on its element substrate. The terminal group 10 is composed of a plurality of power supply terminals and a plurality of input terminals.

The scanning line driving circuit 100 has a Y shift register, a level shifter or the like. The Y transport start pulse DY, the Y clock signal YCK, and the inverted Y clock signal YCKB are supplied to the Y shift register. The Y shift register sequentially transports the Y transport start pulse DY to thus output signals in order in synchronization with the Y clock signal YCK and the inverted Y clock signal YCKB. The level shifter converts the signal amplitudes into large ones to output them to each scanning line 2 as scan signals Y1, Y2, . . . , and Ym.

The data line driving circuit 200 samples the image signals 40R, 40G, and 40B at a predetermined timing to produce data line signals X1 to Xn and supply them to each data line 3. The data line driving circuit 200 includes an X shift register, a level shifter, a sampling circuit or the like. The X shift register transports the X transport start pulse DX in order in synchronization with the X clock signal XCK and the inverted X clock signal XCKB to produce each output signal.

The level shifter converts each level of the output signals of the X shift register to produce respective sampling signals SR1 to SRn in this order. The sampling circuit has n switches SW1 to SWn. Each of the switches SW1 to SWn is composed of TFTs. When each sampling signal SR1 to SRn supplied to the gate is activated in order, each of the switches SW1 to SWn is turned on in order. In this case, the image signals 40R, 40G, and 40B which are supplied through the flexible substrate B are sampled. The data line signals X1 to Xn that are sampled outputs are supplied to the data line 3 in order.

Next, as shown in FIG. 2, m (m is a natural number not less than two) scanning lines 2 are arranged parallel to each other along an X direction, while n (n is a natural number not less than two) data lines 3 are arranged parallel to each other along a Y direction in an image display region A. A gate of the TFT 50 is connected to the scanning line 2, a source of the TFT 50 is connected to the data line 3 and a drain of the TFT 50 is connected to a capacitor 51 and a pixel electrode 6 in each intersecting portion between the scanning lines 2 and the data lines 3. And, each pixel is composed of a pixel electrode 6, a counter electrode formed on a counter substrate, and a liquid crystal interposed between these two electrodes. As a result, pixels are arranged in a matrix to correspond to the respective intersecting portions between the scanning lines 2 and the data lines 3.

In addition, the scan signals Y1, Y2, . . . , and Ym are line-sequentially applied to each scanning line 2 to which the gate of the TFT 50 is connected in a pulse manner. As a result, when the scan signal is supplied to any scanning line 2, the TFT 50 connected to the corresponding scanning line 2 is turned on, so that the data line signals X1, X2, . . . , and Xn supplied from the data lines 3 at a predetermined timing are sequentially written on the corresponding pixels and are kept during a predetermined period.

The alignment or order of the liquid crystal molecule changes in response to the electric potential level applied to each pixel, which allows a gray scale display to be enabled by means of optical modulation. For example, the quantity of light which transmits the liquid crystal is limited in response to the increase of the applied electric potential in a normally white mode, while it is alleviated in response to the increase of the applied electric potential in a normally black mode, so that lights having respective contrasts based on the image signals are emitted per each pixel in the liquid crystal display device. Accordingly, a predetermined display is enabled.

The scanning line test circuit 110 and the data line test circuit 120 are connected to the scanning line 2 and the data line 3, respectively, and for example, test display defects such as point defects and line defects to determine whether the liquid crystal panel is in a good or bad state.

The scanning line test circuit 110 and the data line test circuit 120 are arranged at specific positions to be connected to the first main signal wiring line 132, the second main signal wiring line 134, and the third main signal wiring line 136 which are electrically connected to the test signal output circuit 600 through the flexible substrate B. The signals output from the test signal output circuit 600 are supplied to the scanning line test circuit 110 and the data line test circuit 120 through the first to third main signal wiring lines 132, 134, and 136. The scanning line test circuit 110 and the data line test circuit 120 test whether the liquid crystal panel is in a good or bad state based on the supplied test signals.

Figure 3:
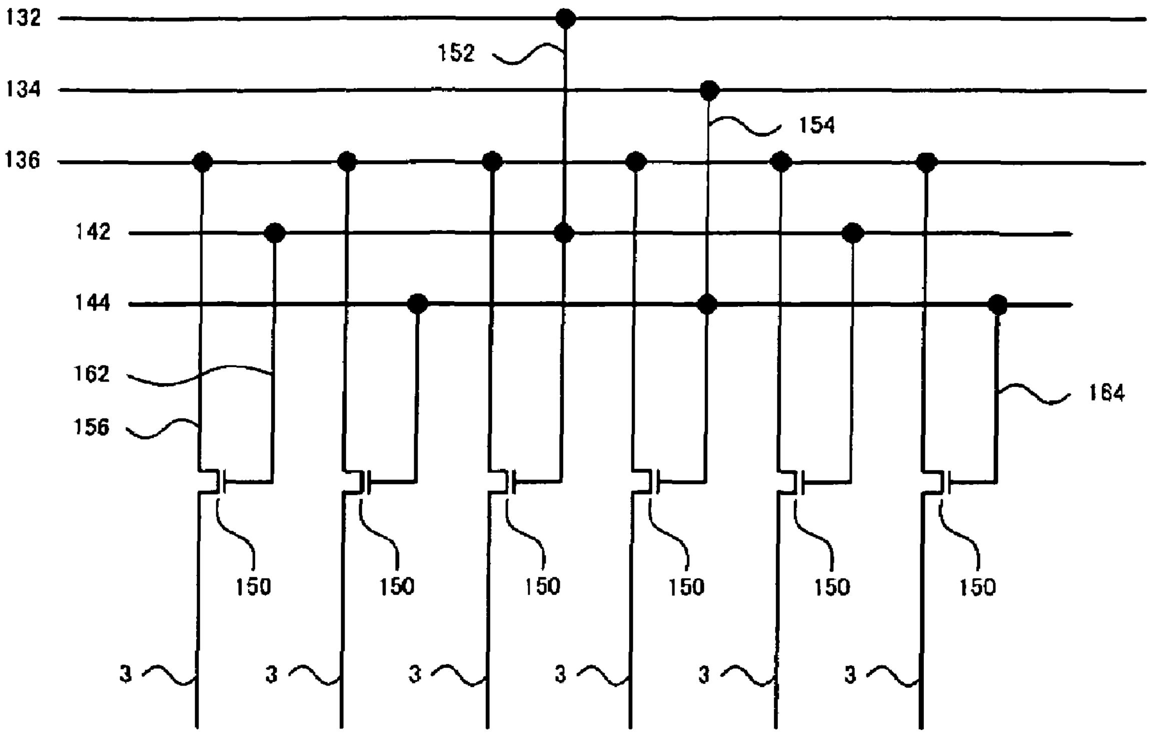
FIG. 3 is a diagram showing a structure of a data line test circuit 120 according to a first embodiment.
Figure 4:
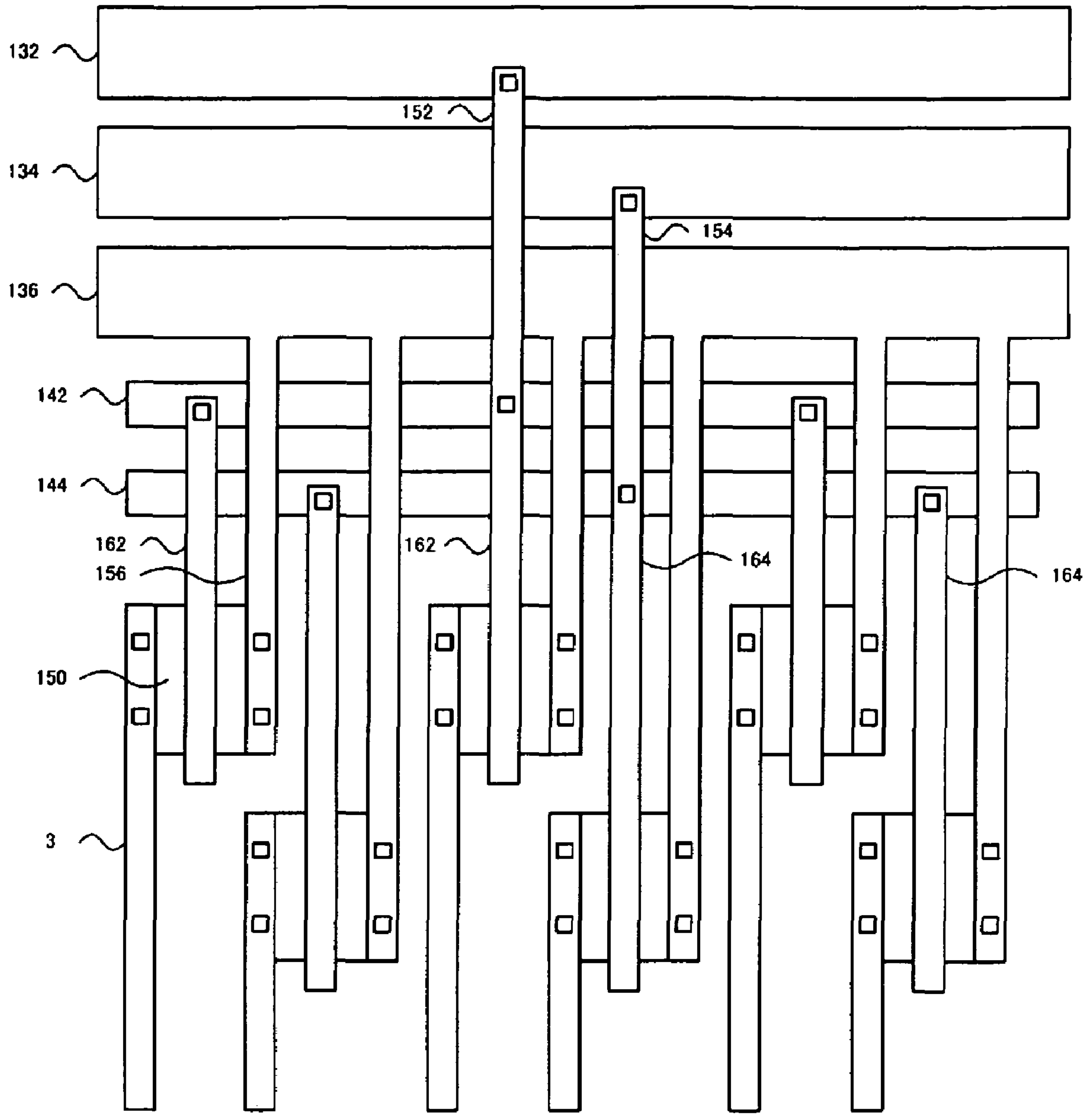
FIG. 4 is a plan view of a layout of the data line test circuit 120 according to the first embodiment.

FIG. 3 is a diagram showing a structure of the data line test circuit 120 according to a first embodiment as one example to which the present invention is applied. FIG. 4 is a plan view showing a layout of the data line test circuit 120 according to the first embodiment. The data line test circuit 120 and the scanning line test circuit 110 of the present embodiment have approximately the same structure, so that a description will be made only on the structure of the data line test circuit 120.

The data line test circuit 120 is composed of a first main signal wiring line 132, a second main signal wiring line 134, a third main signal wiring line 136, a first sub signal wiring line 142, a second sub signal wiring line 144, a first connection wiring line 152, a second connection wiring line 154, a third connection wiring line 156, and a plurality of thin film transistors (TFTs) 150 which is an example among a plurality of elements which constitutes the internal circuit.

The first to third main signal wiring lines 132, 134, and 136 are arranged from one end to the other end of a region where a plurality of pixels is arranged in the image display region A. In addition, the first to third main signal wiring lines 132, 134, and 136 are arranged to be substantially parallel to one another. In addition, the second main signal wiring line 134 is arranged between the first main signal wiring line 132 and the third main signal wiring line 136, and the third main signal wiring line 136 is arranged between the second main signal wiring line 134 and the TFTs 150.

The first and second main signal wiring lines 132 and 134 transmit signals which are supplied to gates of the TFTs 150, and the third main signal wiring line 136 transmits signals which are supplied to sources or drains of the TFTs 150. Alternatively, the first to third main signal wiring lines 132, 134, and 136 may transmit signals or powers such as clock signals, power supply voltages or the like which are supplied through a long distance.

The plurality of TFTs 150 is arranged along the direction where the first to third main signal wiring lines 132, 134, and 136 are continuously present. In addition, the plurality of TFTs 150 includes TFTs 150 connected to the first main signal wiring line 132 as an example of a first element group, and TFTs 150 connected to the second main signal wiring line 134 as an example of a second element group.

Figure 1:
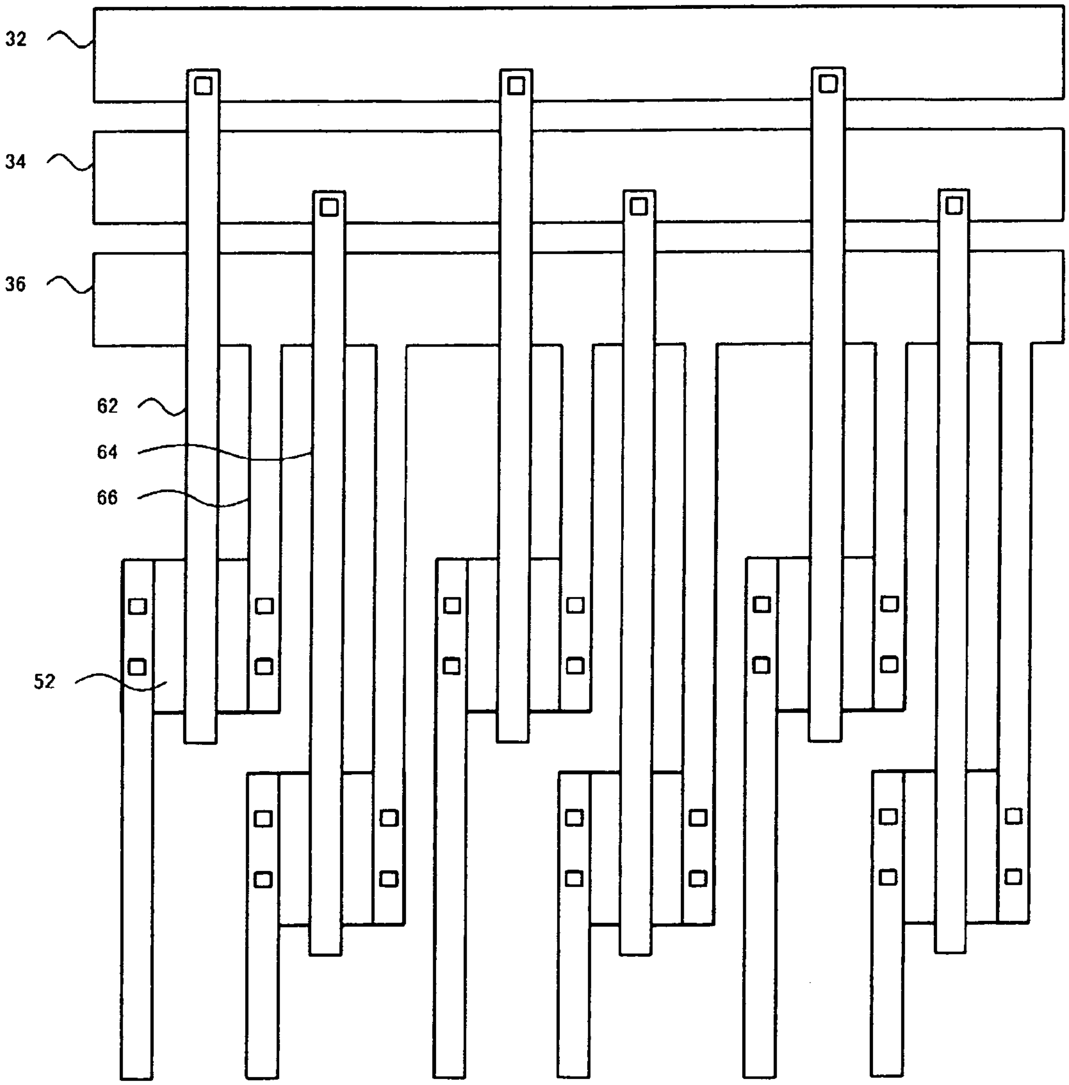
FIG. 1 is a plan view showing a layout of wiring lines in a conventional electro-optical panel.

Each of the TFTs 150 has a gate, a source, and a drain, wherein a signal which has been transmitted through the first main signal wiring line 132 or the second main signal wiring line 134 is supplied to the gate, and a signal which has been transmitted through the third main signal wiring line 136 is supplied to one of the source and the drain. In addition, each of the TFTs 150 is arranged to correspond to the data lines 3, respectively, and the other of the source and the drain is connected to the data line 3. That is, the TFTs 150 control whether the signals which have been transmitted through the third main signal wiring line 136 are supplied to the data lines 3 based on the electric potentials of the signals supplied to the gates through the flexible substrate B from the test signal output portion 600 (see FIG. 1). Alternatively, the TFT 150 may supply the signals which are transmitted through the data line 3 to the third main signal wiring line 136 based on the electric potentials of the signals supplied to the gates.

The first sub signal wiring line 142 serves to receive the signals which have been transmitted through the first main signal wiring line 132 and supply them to the TFTs 150. In detail, the first sub signal wiring line 142 is connected to the first main signal wiring line 132 by means of the first connection wiring line 152 which is interposed therebetween, and supplies the corresponding signal to the corresponding TFT 150 which is connected to the first sub signal wiring line 142 through first element wiring lines 162.

The width of the first sub signal wiring line 142 is narrower than that of the first main signal wiring line 132, and the first sub signal wiring line 142 is arranged to be substantially parallel to the first main signal wiring line 132. In addition, the first sub signal wiring line 142 is arranged between the third main signal wiring line 136 and the TFTs 150. In detail, the first sub signal wiring line 142 is arranged to be adjacent to and between the third main signal wiring line 136 and the second sub signal wiring line 144. The width of the first sub signal wiring line 142 may be not more than a half width of the first main signal wiring line 132. The width of the first sub signal wiring line 142 may be about 10 μm when the width of the first main signal wiring line 132 is 30 μm.

The first connection wiring line 152 is connected to the first main signal wiring line 132 and the first sub signal wiring line 142, and supplies the signal which has been transmitted through the first main signal wiring line 132 to the first sub signal wiring line 142. The first connection wiring line 152 is bridged over the second and third main signal wiring lines 134 and 136. In addition, the first connection wiring line 152 is arranged to be approximately vertical to the first main signal wiring line 132 and the first sub signal wiring line 142. In addition, the width of the first connection wiring line 152 is preferably narrower than that of the first main signal wiring line 132.

The number of the first connection wiring line 152 is preferably less than that of the first element wiring line 162. For example, the number of the first connection wiring line 152 is typically one with respect to a block consisting of the plurality of TFTs 150, or one connection wiring line 152 is arranged with respect to the plurality of corresponding blocks.

The first element wiring line 162 supplies signals which have been transmitted through the first sub signal wiring line 142 to the TFTs 150. In detail, the first element wiring line 162 is connected to the first sub signal wiring line 142 and is also arranged as the gate electrode of the TFT 150, and controls whether the corresponding TFT 150 is supplied with electricity based on the electric potential of the corresponding signal.

The first element wiring line 162 is bridged over the second sub signal wiring line 144. In addition, the first element wiring line 162 is arranged to be approximately vertical to the first sub signal wiring line 142. In addition, the width of the first element wiring line 162 is preferably narrower than that of the first main signal wiring line 132.

The second sub signal wiring line 144 serves to receive the signals which have been transmitted through the second main signal wiring line 134 and supply them to the TFTs 150. In detail, the second sub signal wiring line 144 is connected to the second main signal wiring line 134 by means of the second connection wiring line 154 which is interposed therebetween, and supplies the corresponding signal to the TFT 150 which is connected to the second sub signal wiring line 144 through a second element wiring line 164.

The width of the second sub signal wiring line 144 is narrower than that of the second main signal wiring line 134, and the second sub signal wiring line 144 is arranged to be substantially parallel to the second main signal wiring line 134. In addition, the second sub signal wiring line 144 is arranged between the first sub signal wiring line 142 and the TFTs 150 and is adjacent to the first sub signal wiring line 142. The width of the second sub signal wiring line 144 may be not more than a half width of the second main signal wiring line 134. The width of the second sub signal wiring line 144 may be about 10 μm when the width of the second main signal wiring line 134 is 30 μm.

The second connection wiring line 154 is connected to the second main signal wiring line 134 and the second sub signal wiring line 144, and supplies signals which have been transmitted through the second main signal wiring line 134 to the second sub signal wiring line 144. The second connection wiring line 154 is bridged over the third main signal wiring line 136 and the first sub signal wiring line 142. In addition, the second connection wiring line 154 is arranged to be approximately vertical to the second main signal wiring line 134 and the second sub signal wiring line 144. In addition, the width of the second connection wiring line 154 is preferably narrower than that of the second main signal wiring line 134.

The number of the second connection wiring line 154 is preferably less than that of the second element wiring line 164. For example, the number of the second connection wiring line 154 is typically one with respect to a block consisting of the plurality of TFTs 150, or one second connection wiring line 154 is arranged with respect to the plurality of corresponding blocks. In addition, the number of the first connection wiring line 152 may be the same as that of the second connection wiring line 154.

The second element wiring line 164 supplies signals which have been transmitted through the second sub signal wiring line 144 to the TFTs 150. In detail, the second element wiring line 164 is connected to the second sub signal wiring line 144, and is also arranged as the gate electrode of the TFT 150, and controls whether the corresponding TFT 150 is provided with electricity based on the electric potential of the corresponding signal.

The second element wiring line 164 is arranged to be approximately vertical to the second sub signal wiring line 144. In addition, some of the second element wiring lines 164 are formed together with the second connection wiring line 154 as one body. In addition, the width of the second element wiring line 164 is preferably narrower than that of the second main signal wiring line 134.

The third connection wiring line 156 is connected to the third main signal wiring line 136 and the TFT 150, and supplies the signals which have been transmitted through the third main signal wiring line 136 to the TFT 150. In the present embodiment, the third connection wiring line 156 is arranged to each of the TFTs 150. In addition, the third connection wiring line 156 is formed together with the third main signal wiring line 136 as one body.

The third connection wiring line 156 is bridged over the first and second sub signal wiring lines 142 and 144. In addition, the third connection wiring line 156 is arranged to be approximately vertical to the third main signal wiring line 136. In addition, the width of the third connection wiring line 156 is preferably narrower than that of the third main signal wiring line 136. Alternatively, the data line test circuit 120 may have a sub signal wiring line whose width is narrower than that of the third main signal wiring line 136, an connection wiring line connected to the corresponding sub signal wiring line and the third main signal wiring line 136, and an element wiring line connected to the corresponding connection wiring line and the TFT 150, as in the first and second sub signal wiring lines 142 and 144.

According to the present embodiment described above, when the TFT 150 is connected to the first main signal wiring line 132, the TFT 150 is electrically connected to the first main signal wiring line 132 through the first sub signal wiring line 142 which is interposed therebetween. In this case, the second main signal wiring line 134 is arranged between the first main signal wiring line 132 and the first sub signal wiring line 142. Accordingly, the first element wiring line 162 is not bridged over the first and second main signal wiring lines 132 and 134, so that the area where these wiring lines cross each other may be decreased. Furthermore, the width of the first sub signal wiring line 142 is made narrower than that of the first main signal wiring line 132, so that the parasitic capacitance due to the crossing wiring lines may be decreased, which may lead to a significant decrease in the time constant of the signal transmitting characteristic. Accordingly, according to the present embodiment, it is possible to provide the electro-optical device which operates at a high speed and has less operation errors.

In addition, according to the present embodiment, even when widths of the first and second main signal wiring lines 132 and 134 and/or the width of the third main signal wiring line 136 increase for the sake of decreasing the wiring resistance, the area in which the wiring lines cross does not significantly increase. Accordingly, according to the present embodiment, the parasitic capacitance due to the crossing wiring lines may be suppressed even when the width of the first main signal wiring line 132 or the like increases.

Figure 5:
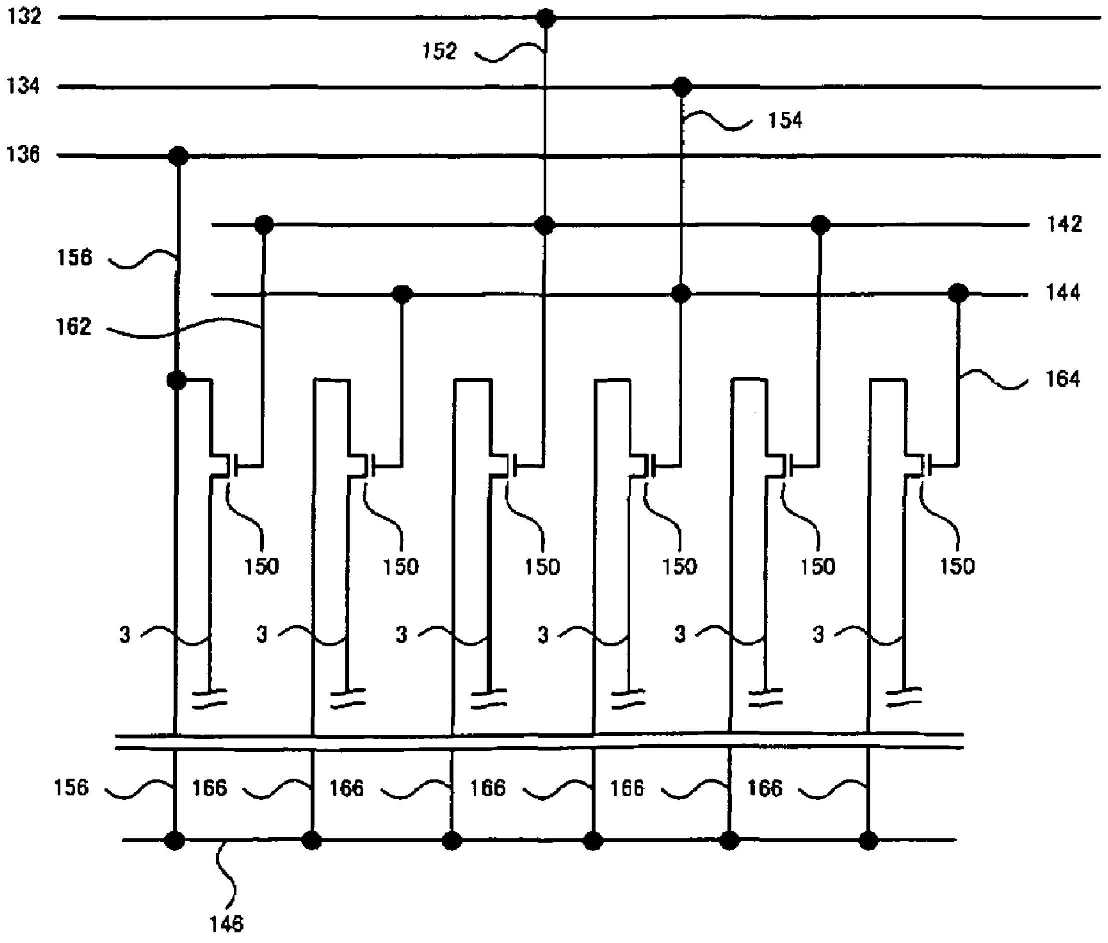
FIG. 5 is a diagram showing a structure of a data line test circuit 120 according to a second embodiment.
Figure 6:
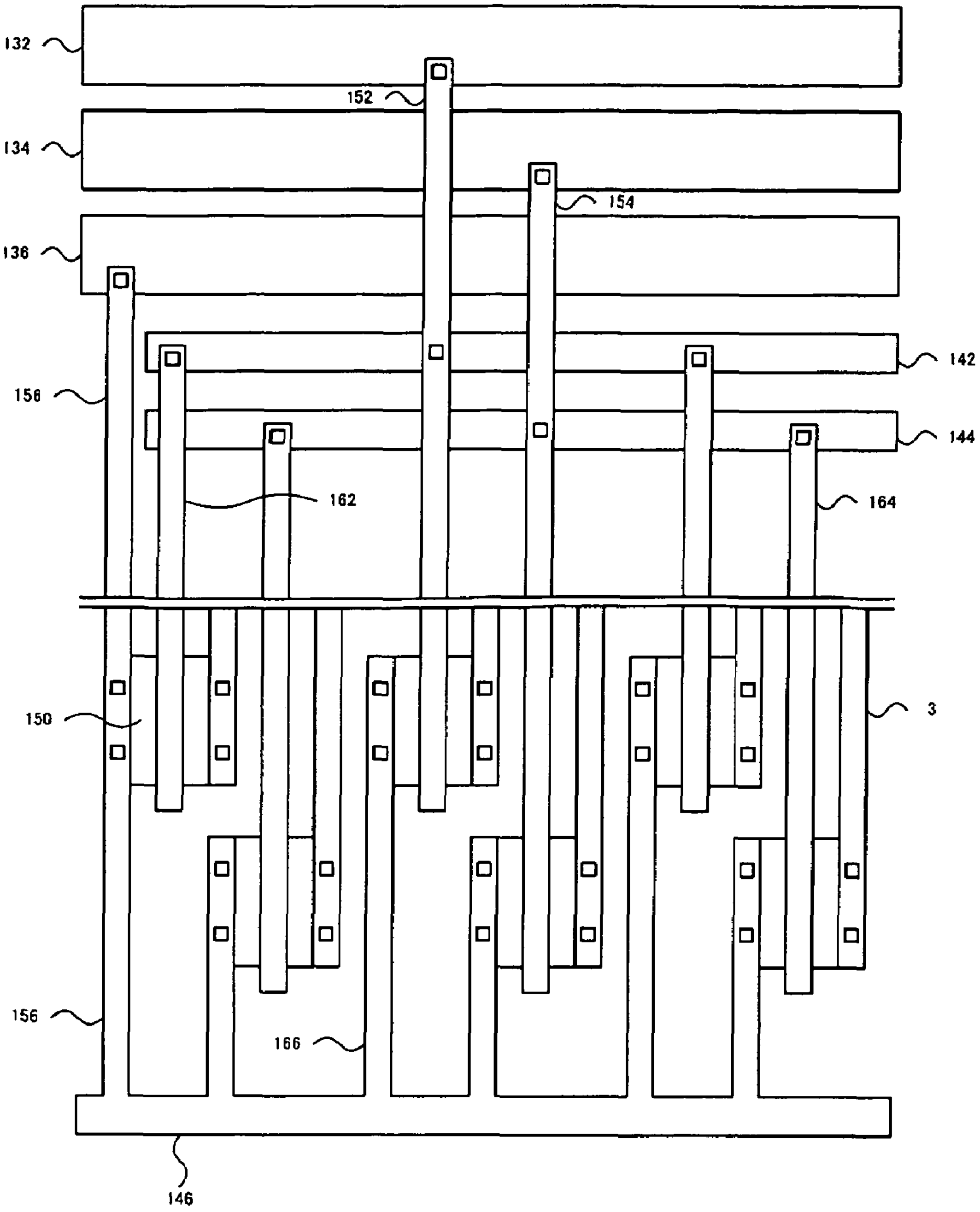
FIG. 6 is a plan view of a layout of the data line test circuit 120 according to a second embodiment.

FIG. 5 is a diagram showing a structure of a data line test circuit 120 according to a second embodiment as an example to which the present invention is applied. In addition, FIG. 6 is a plan view showing a layout of the data line test circuit 120 according to the second embodiment. The data line test circuit 120 and the scanning line test circuit 110 of the present embodiment also have approximately the same structure, so that a description will be made only on the structure of the data line test circuit 120. In addition, components having the same reference numerals as those of the first embodiment have the same functions as in the first embodiment, so that a description will be made on the data line test circuit 120 of the second embodiment based on the different features from the first embodiment.

In the present embodiment, the data line test circuit 120 is further composed of a third sub signal wiring line 146 whose width is narrower than that of the third main signal wiring line 136, and third element wiring lines 166 connected to the third sub signal wiring line 146 and the TFTs 150. The third connection wiring line 156 is connected to the third main signal wiring line 136 and the third sub signal wiring line 146, and supplies the signals which have been transmitted through the third main signal wiring line 136 to the third sub signal wiring line 146. The width of the third sub signal wiring line 146 may be not more than a half width of the third main signal wiring line 136. The width of the third sub signal wiring line 146 is, for example, about 10 μm when the width of the third main signal wiring line 136 is 30 μm.

The third sub signal wiring line 146 is arranged to be approximately parallel to the third main signal wiring line 136, and the third connection wiring line 156 is arranged to be approximately vertical to the third main signal wiring line 136 and the third sub signal wiring line 146.

In the present embodiment, the first and second sub signal wiring lines 142 and 144 are arranged in each region (block) where the first and second connection wiring lines 152 and 154 are arranged, and the third connection wiring line 156 is arranged between corresponding regions. That is, the third connection wiring line 156 is not bridged over the first sub signal wiring line 142 and the second connection wiring line 154.

Alternatively, the third connection wiring line 156 may be bridged over the first sub signal wiring line 142 and/or the second sub signal wiring line 144. In this case, the first and second sub signal wiring lines 142 and 144 may be arranged from one end to the other end of a region where a plurality of pixels is arranged in the image display region A, as in the first and second main signal wiring lines 132 and 134. That is, the first and second sub signal wiring lines 142 and 144 may be arranged for each block or may be arranged over a plurality of the blocks.

The TFT 150 is arranged between the third main signal wiring line 136 and the third sub signal wiring line 146. In detail, some or all of the pixels arranged in the image display region A may be arranged between the third main signal wiring line 136 and the third sub signal wiring line 146, and the TFT 150 maybe arranged between the corresponding pixel and the third sub signal wiring line 146.

In the present embodiment, the third connection wiring line 156 is not only connected to the third sub signal wiring line 146 but also connected to some of the plurality of TFTs 150. That is, the third connection wiring line 156 also serves as the third element wiring line 166 which connects the third sub signal wiring line 146 to the TFT 150.

According to the present embodiment described above, the third element wiring line 166 may connect the third sub signal wiring line 146 to the TFT 150 so as not to be bridged over the first and second sub signal wiring lines 142 and 144. Therefore, according to the present embodiment, the areas where the wiring lines cross may further decrease, which may further suppress the increase of the parasitic capacitance due to the crossing wiring lines.

Furthermore, even when the third element wiring line 166 is bridged over the first and second sub signal wiring lines 142 and 144, the areas where the wiring lines cross may further decrease as compared to the case that each TFT 150 is connected to the third main signal wiring line 136.

Figure 7:
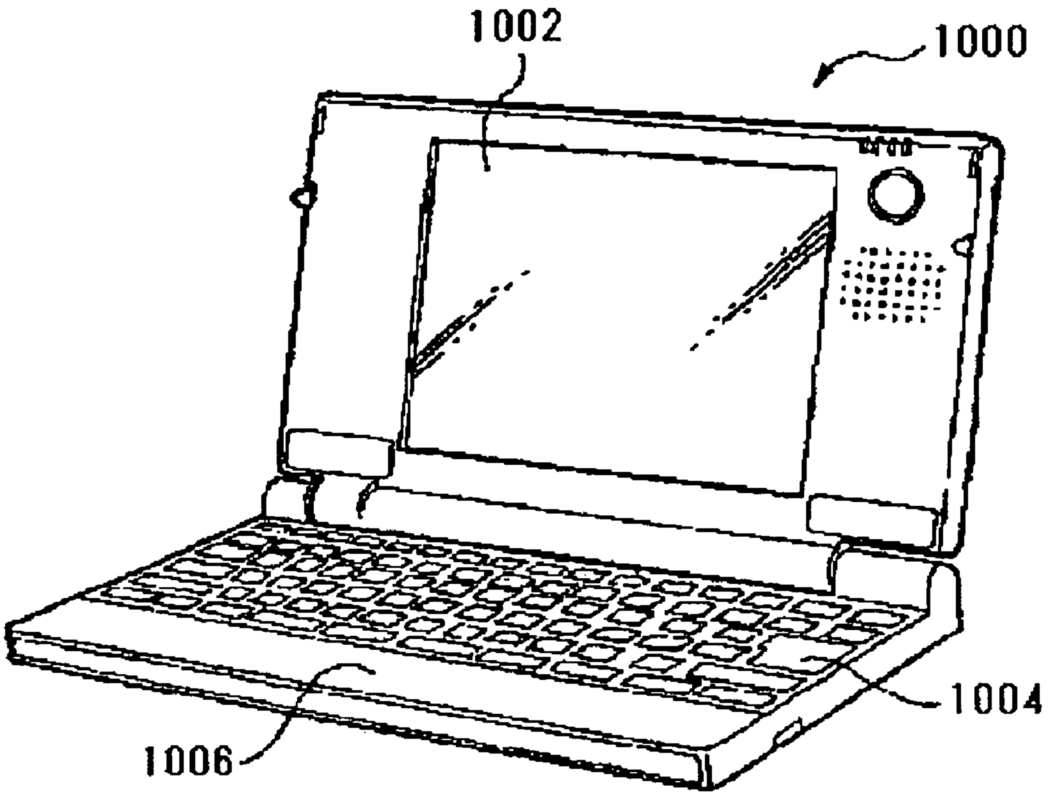
FIG. 7 is a perspective view showing a structure of a personal computer 1000 as an example of an electronic apparatus of the present invention.

FIG. 7 is a perspective view showing a structure of a personal computer 1000 which is an example of an electronic apparatus of the present invention. Referring to FIG. 7, the personal computer 1000 is composed of a display panel 1002, and a main body 1006 having a keyboard 1004. The electro-optical device of the present invention is applied to the display panel 1002 of the personal computer 1000.

The foregoing embodiment and modification are merely exemplary and not to limit the scope of the claims, and many alternatives, modifications, and variations may be readily applied to other types of the electro-optical device employing the changes, a method for driving the same, and various electronic apparatuses including the electro-optical device. For example, the electro-optical device of the present invention is applied to the liquid crystal display device in the above-mentioned embodiments, however, the electro-optical device of the present invention is not limited thereto and may also be applied to an organic EL display device or the like. In addition, the present invention is applied to the data line test circuit in the above-mentioned embodiment, however, it is not limited thereto and may also be applied to other circuits such as a scanning line driving circuit, a data line driving circuit or the like.

What is claimed is:

1. An electro-optical device, comprising:

a first main signal wiring line which is arranged to correspond to a unit circuit and which transmits a predetermined signal;

a first sub signal wiring line whose width is narrower than that of the first main signal wiring line;

a second main signal wiring line arranged between the first main signal wiring line and the first sub signal wiring line;

a first connection wiring line which is connected to the first main signal wiring line and the first sub signal wiring line and which is bridged over the second main signal wiring line; and an internal circuit having a plurality of elements connected to the first sub signal wiring line, wherein the predetermined signal is branched from the first main signal wiring line and is supplied to the internal circuit through the first sub signal wiring line, and the first and second main signal wiring lines are arranged approximately parallel to one another.

2. The electro-optical device according to claim 1, further comprising:

a second sub signal wiring line whose width is narrower than that of the second main signal wiring line; and a second connection wiring line which is connected to the second main signal wiring line and the second sub signal wiring line and which is bridged over the first sub signal wiring line, wherein the plurality of elements is connected to the second sub signal wiring line, and the second main signal wiring line is arranged between the first main signal wiring line and the second sub signal wiring line.

3. The electro-optical device according to claim 2, wherein the first sub signal wiring line is arranged between the second main signal wiring line and the second sub signal wiring line.

4. The electro-optical device according to claim 2, wherein the first and second sub signal wiring lines are arranged between the plurality of elements and the first and second main signal wiring lines.

5. The electro-optical device according to claim 2, wherein the first and second sub signal wiring lines are arranged approximately parallel to each other.

6. The electro-optical device according to claim 4, further comprising:

a third main signal wiring line arranged between the first main signal wiring line and the first and second sub signal wiring lines, wherein the first and second connection wiring lines are bridged over the third main signal wiring line, and the plurality of elements is connected to the third main signal wiring line.

7. The electro-optical device according to claim 6, further comprising:

a third sub signal wiring line whose width is narrower than that of the third main signal wiring line; and a third connection wiring line connected to the third main signal wiring line and the third sub signal wiring line, wherein the plurality of elements is arranged between the third main signal wiring line and the third sub signal wiring line, and is connected to the third main signal wiring line through the third sub signal wiring line.

8. The electro-optical device according to claim 6, wherein the first to third main signal wiring lines are arranged approximately parallel to one another.

9. An electronic apparatus comprising the electro-optical device according to claim 1.

* * * * *